United States Patent
Chen et al.

(10) Patent No.: US 8,618,655 B2
(45) Date of Patent: Dec. 31, 2013

(54) CARRIER-FREE SEMICONDUCTOR PACKAGE

(75) Inventors: Ching-Hua Chen, Taichung (TW); Heng-Cheng Chu, Taichung (TW); Hsin-Lung Chung, Taichung (TW); Chih-Hsien Chiu, Taichung (TW); Chia-Yang Chen, Taichung (TW)

(73) Assignee: Siliconware Precision Industries Co., Ltd, Taichung (TW)

( * ) Notice: Subject to any disclaimer, the term of this patent is extended or adjusted under 35 U.S.C. 154(b) by 0 days.

(21) Appl. No.: 13/111,506

(22) Filed: May 19, 2011

(65) Prior Publication Data
US 2012/0228769 A1    Sep. 13, 2012

(30) Foreign Application Priority Data
Mar. 10, 2011 (TW) .............................. 100108040 A

(51) Int. Cl.
*H01L 23/34* (2006.01)
(52) U.S. Cl.
USPC .................................. 257/728; 257/E23.011
(58) Field of Classification Search
CPC ............ H01L 23/66; H01L 2924/3011; H01L 2924/01079
USPC .......................... 257/678, 701, 728, E23.011
See application file for complete search history.

(56) References Cited

U.S. PATENT DOCUMENTS

| | | | |
|---|---|---|---|
| 5,640,048 A * | 6/1997 | Selna ............................. | 257/738 |
| 2004/0108586 A1* | 6/2004 | Lamson et al. ............... | 257/691 |
| 2005/0023704 A1* | 2/2005 | Lin et al. ....................... | 257/781 |
| 2006/0079081 A1* | 4/2006 | Hsu et al. ...................... | 438/618 |
| 2008/0145967 A1 | 6/2008 | Chew et al. | |
| 2009/0075428 A1* | 3/2009 | Tang et al. .................... | 438/114 |

* cited by examiner

*Primary Examiner* — Nikolay Yushin
(74) *Attorney, Agent, or Firm* — Edwards Wildman Palmer LLP; Peter F. Corless; Steven M. Jensen

(57) ABSTRACT

A carrier-free semiconductor package includes a circuit structure having an insulating layer and a circuit layer embedded in the insulating layer and having a plurality of conductive traces and RF (radio frequency) traces, a chip disposed on a first surface of the insulating layer and electrically connected to the conductive traces, an encapsulant covering the chip and the circuit layer, a ground layer formed on a second surface of the insulating layer opposite to the first surface, and a plurality of solder balls disposed on the conductive traces or terminals on the conductive traces, wherein portions of the solder balls electrically connect the ground layer so as to allow the RF traces and the ground layer to form a microstrip line having an RF function, thus obtaining a single-layer carrier-free semiconductor package having low cost and simplified RF design.

7 Claims, 7 Drawing Sheets

CARRIER-FREE SEMICONDUCTOR PACKAGE

CROSS-REFERENCES TO RELATED APPLICATIONS

This application claims under 35 U.S.C. §119(a) the benefit of Taiwanese Application No. 100108040, filed Mar. 10, 2011, the entire contents of which is incorporated herein by reference.

BACKGROUND OF THE INVENTION

1. Field of the Invention

The present invention relates to semiconductor packages and fabrication methods thereof, and more particularly, to a carrier-free semiconductor package and a fabrication method thereof.

2. Description of Related Art

To meet consumer demands for convenience and portability, electronic products are becoming much lighter, thinner, shorter and smaller. In addition, electronic products are required to have high efficient performance, low power consumption and multi-function. Generally, semiconductor chips are mounted on packaging substrates and encapsulated so as to achieve high electrical performance However, the packaging substrates increase the overall thickness of final packages.

Accordingly, US Patent Application Publication No. 20080145967 discloses a carrier-free semiconductor package and a fabrication method thereof, as shown in FIGS. 1A to 1H.

Referring to FIG. 1A, a carrier 10 is provided.

Referring to FIG. 1B, a resist layer 11 is formed on the carrier 10 and a plurality of openings 110 are formed in the resist layer 11 for exposing portions of the carrier 10.

Referring to FIG. 1C, by using the carrier 10 as a current conductive path for electroplating, conductive traces 12 are formed on the portions of the carrier 10 in the openings 110 of the resist layer 11.

Referring to FIG. 1D, the resist layer 11 is removed to expose the carrier 10 and the conductive traces 12 on the carrier 10.

Referring to FIG. 1E, a mold 13 is disposed on the carrier 10. The mold 13 has a mold cavity 130, and a plurality of protrusions 131 that abut against the conductive traces 12, respectively.

Referring to FIG. 1F, an insulating material is injected into the mold cavity 130 so as to form an insulating layer 14 in the mold cavity 130. Meanwhile, a plurality of openings 140 are formed at positions corresponding to the protrusions 131.

Referring to FIG. 1G, the mold 13 and the carrier 10 are removed such that the conductive traces 12 are embedded in the insulating layer 14. Bottom surfaces of the conductive traces 12 are exposed through a bottom surface of the insulating layer 14 while top surfaces of the conductive traces 12 are exposed through the openings 140, respectively.

Referring to FIG. 1H, a plurality of solder balls 15 are disposed on the top surfaces of the conductive traces 12 in the openings 140, and a chip 16 is electrically connected to the bottom surfaces of the conductive traces 12 exposed through the bottom surface of the insulating layer 14, thus forming a carrier-free semiconductor package.

However, the above-described single-layer carrier-free package is difficult to be applied in RF (radio frequency) field, since a ground design is required for the characteristic impedance of a microstrip line and also a carrier such as a dielectric layer needs to be disposed between RF traces and the ground.

Therefore, there is a need to provide a carrier-free semiconductor package having an RF function and a fabrication method thereof.

SUMMARY OF THE INVENTION

Accordingly, the present invention provides a carrier-free semiconductor package, which comprises: a circuit structure having an insulating layer with opposite first and second surfaces, a circuit layer embedded in the insulating layer and exposed from the first surface of the insulating layer and having a plurality of conductive traces and RF (radio frequency) traces, and a plurality of openings formed on the second surface of the insulating layer for exposing the conductive traces, respectively; a chip disposed on the first surface of the insulating layer and electrically connected to the circuit layer; an encapsulant formed on the first surface of the insulating layer to cover the circuit layer and the chip; and a ground layer formed on the second surface of the insulating layer and having a plurality of openings for exposing the openings of the insulating layer and portions of the second surface of the insulating layer.

The above-described semiconductor package can further comprise a plurality of solder balls disposed on the conductive traces in the openings of the insulating layer, wherein portions of the solder balls electrically connect the ground layer. The circuit structure can further comprise a plurality of terminals formed on the conductive traces in the openings of the insulating layer, and the solder balls are disposed on the terminals, respectively.

The semiconductor package can further comprise a protection layer formed on the ground layer and the second surface of the insulating layer and having a plurality of openings for exposing the openings of the insulating layer, respectively. Further, top surfaces of the terminals can be flush with the second surface of the insulating layer.

The protection layer can be made of solder mask or polyimide.

The present invention further provides a fabrication method of a carrier-free semiconductor package, which comprises the steps of: forming on a carrier a circuit layer having a plurality of conductive traces and RF traces; forming an insulating layer on the carrier and the circuit layer, wherein the insulating layer has a plurality of openings for exposing the conductive traces, respectively, and has a first surface in contact with the carrier and a second surface opposite to the first surface; removing the carrier to expose the first surface of the insulating layer and the circuit layer; disposing a chip on the first surface of the insulating layer and electrically connecting the chip and the circuit layer; forming an encapsulant on the first surface of the insulating layer to cover the circuit layer and the chip; and forming a ground layer on the second surface of the insulating layer.

The method can further comprise the step of disposing a plurality of solder balls on the conductive traces in the openings of the insulating layer, respectively, wherein portions of the solder balls electrically connect the ground layer.

Before removing the carrier, the method can further comprise the step of forming terminals on the conductive traces in the openings of the insulating layer such that the solder balls can be disposed on the terminals.

The step of forming the circuit layer can comprise the steps of: forming on the carrier a first resist layer having a plurality of openings for exposing portions of the carrier; forming the circuit layer on the portions of the carrier in the openings of the first resist layer; and removing the first resist layer to expose the carrier and the circuit layer on the carrier.

The step of forming the insulating layer and the openings of the insulating layer can comprise the steps of: disposing on the carrier a mold having a mold cavity and a plurality of protrusions, wherein the protrusions abut against the conductive traces of the circuit layer, respectively; injecting an insulating material into the mold cavity so as to form the insulating layer; and removing the mold to expose the insulating layer, thereby forming the openings of the insulating layer corresponding in position to the protrusions of the mold for exposing the conductive traces, respectively.

The step of forming the ground layer can comprise the steps of: forming a metal layer on the second surface of the insulating layer; and patterning the metal layer to form the ground layer having a plurality of openings for exposing the openings of the insulating layer and portions of the second surface of the insulating layer.

After forming the ground layer, the method can further comprise the step of forming a protection layer on the ground layer and the second surface of the insulating layer, wherein the protection layer has a plurality of openings for exposing the openings of the insulating layer, respectively.

The present invention provides another fabrication method of a carrier-free semiconductor package. Different from the above-described method, the present method comprises the step of forming terminals on the conductive traces, respectively, before forming the insulating layer.

Further, the step of forming the circuit layer and the terminals can comprise the steps of: forming on the carrier a first resist layer having a plurality of openings for exposing portions of the carrier; forming the circuit layer on the portions of the carrier in the openings of the first resist layer; removing the first resist layer to expose the carrier and the circuit layer on the carrier; forming a second resist layer on the carrier and the circuit layer, the second resist layer having a plurality of openings for exposing the conductive traces of the circuit layer, respectively; forming the terminals on the conductive traces in the openings of the second resist layer; and removing the second resist layer.

Therefore, the present invention involves forming a circuit structure having an insulating layer and a circuit layer embedded in the insulating layer and having a plurality of conductive traces and RF traces, disposing a chip on a first surface of the insulating layer and electrically connecting the chip and the conductive traces, forming an encapsulant to cover the chip and the circuit layer, forming a ground layer on a second surface of the insulating layer opposite to the first surface, and disposing a plurality of solder balls on the conductive traces or terminals on the conductive traces, wherein portions of the solder balls electrically connect the ground layer so as to allow the RF traces and the ground layer to form a microstrip line having an RF function, thus obtaining a single-layer carrier-free semiconductor package having low cost and simplified RF design.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "one", "above", etc. are merely for illustrative purpose and should not be construed to limit the scope of the present invention.

First Embodiment

FIGS. 2A to 2M are cross-sectional views showing a carrier-free semiconductor package and a fabrication method thereof according to a first embodiment of the present invention.

Figure 1A:
FIGS. 1A to 1H are schematic cross-sectional views showing a semiconductor package and a fabrication method thereof according to US Patent Application Publication No. 2008/0145967.
Figure 1B:
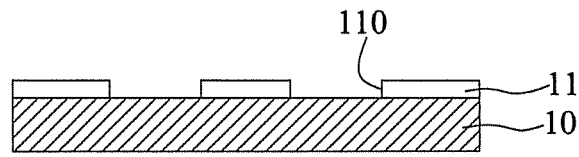
Figure 1C:
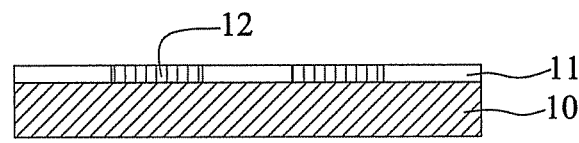
Figure 1D:
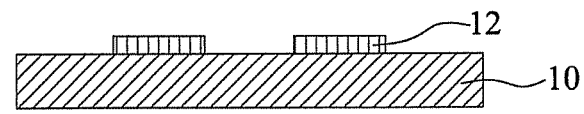
Figure 1E:
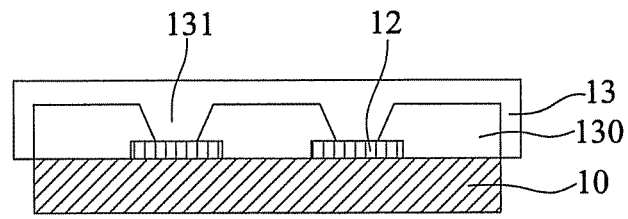
Figure 1F:
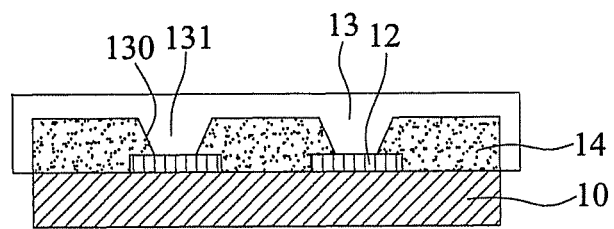
Figure 1G:
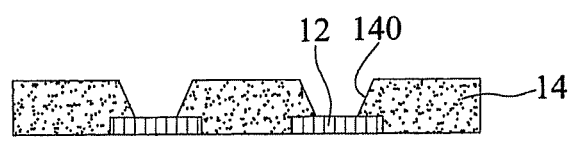
Figure 1H:
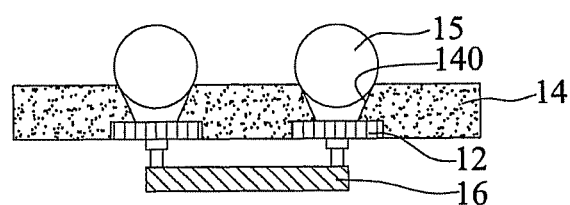
Figure 2A:
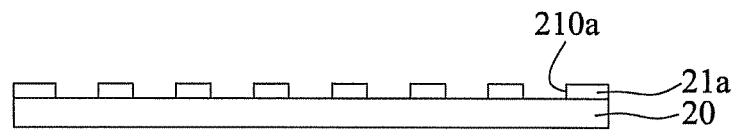
FIGS. 2A to 2M are schematic cross-sectional views showing a carrier-free semiconductor package and a fabrication method thereof according to a first embodiment of the present invention, wherein FIG. 2G' shows another embodiment of FIG. 2G and FIG. 2M' shows another embodiment of FIG. 2M.

Referring to FIG. 2A, a carrier 20 made of metal is provided. A first resist layer 21a is formed on the carrier 20 and patterned so as to form a plurality of openings 210a in the first resist layer 21a for exposing portions of the carrier 20.

Figure 2B:
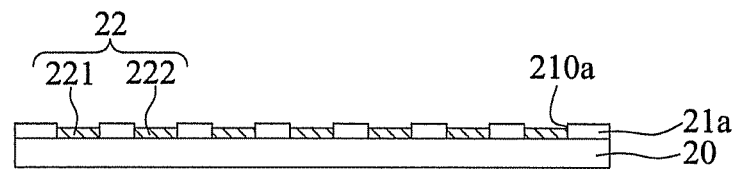

Referring to FIG. 2B, an electroplating process is performed to form a circuit layer 22 on the portions of the carrier 20 in the openings 210a of the first resist layer 21a. Therein, the circuit layer 22 comprises a plurality of conductive traces 221 and RF traces 222.

Figure 2C:
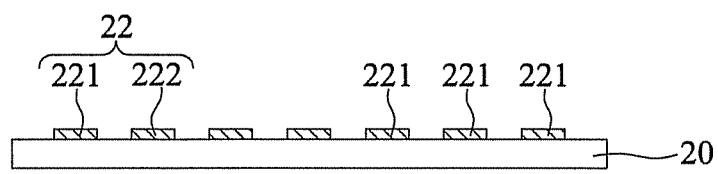

Referring to FIG. 2C, the first resist layer 21a is removed to expose the carrier 20 and the circuit layer 22 on the carrier 20.

Figure 2D:
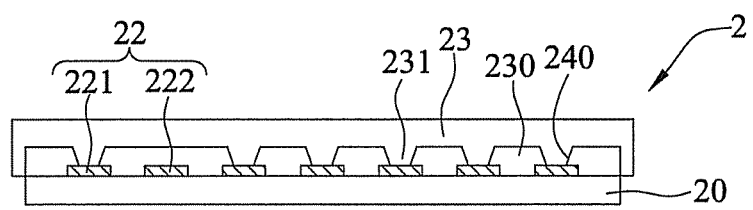

Referring to FIG. 2D, a mold 23 having a mold cavity 230 and a plurality of protrusions 231 is disposed on the carrier 20, and the protrusions 231 abut against the conductive traces 221 of the circuit layer 22, respectively.

Figure 2E:
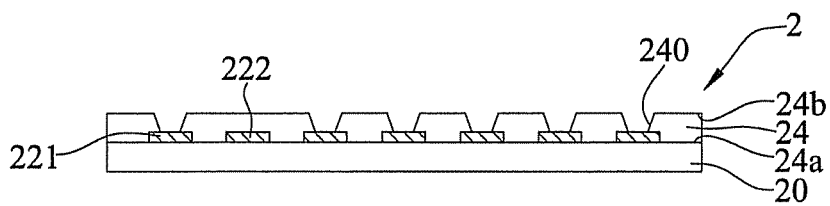

Referring to FIG. 2E, an insulating material is injected into the mold cavity 230 of the mold 23 so as to form an insulating layer 24 in the mold cavity 230. After the insulating material is cured, the mold 23 is removed, thereby forming on the carrier 20 the insulating layer 24 having a plurality of openings 240 corresponding in position to the protrusions 231 of the mold for exposing the conductive traces 221, respectively. The insulating layer 24 has a first surface 24a in contact with the carrier 20 and a second surface 24b opposite to the first surface 24a.

Figure 2F:
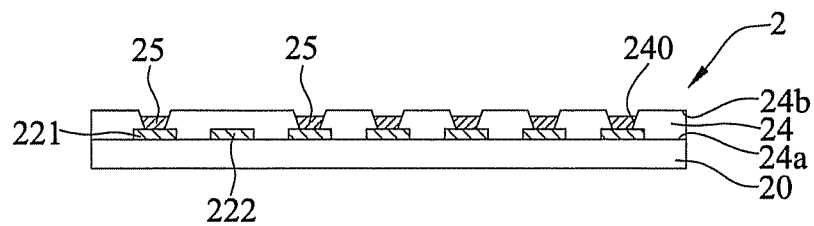

Referring to FIG. 2F, a plurality of terminals 25 are formed on the conductive traces 221 in the openings 240 by electroplating. In another embodiment, no terminals 25 are formed, and a plurality of solder balls 30 are directly disposed on the conductive traces 221 in the openings 240. In addition, an OSP (organic solderability preservative) process can be performed to the terminals 25.

Figure 2G:
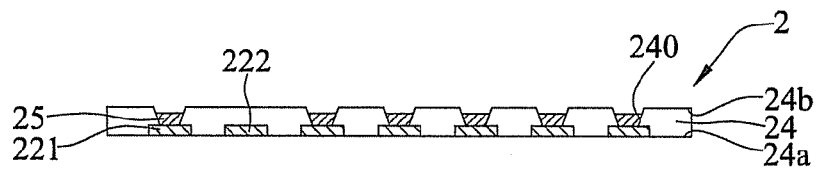
Figure 2G:
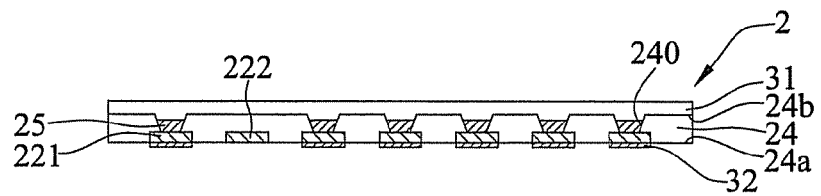

Referring to FIG. 2G, the carrier 20 is removed such that the first surface 24a of the insulating layer 24 and the circuit layer 22 are exposed to form a circuit structure 2. Alternatively, referring to FIG. 2G', a copper layer 31 is formed on the terminals 25 and the second surface 24b of the insulating layer 24. Then, the carrier 20 is removed, and an electroplating process is performed to form on the conductive traces 221 a bondable metal layer 32 made of such as Ni/Pd/Au. Subsequently, the copper layer 31 is removed.

Figure 2H:
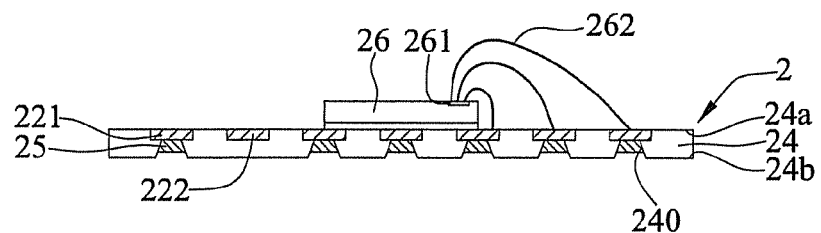

Referring to FIG. 2H, the circuit structure 2 is turned upside down such that the first surface 24a of the insulating layer 24 faces up. Further, a chip 26 having a plurality of electrode pads 261 is disposed on the first surface 24a of the insulating layer 24 and a plurality of bonding wires 262 are formed to electrically connect the conductive traces 221 on the first surface 24a and the electrode pads 261 of the chip 26. Alternatively, the chip 26 can be flip-chip electrically connected to the circuit layer 22.

Figure 2I:
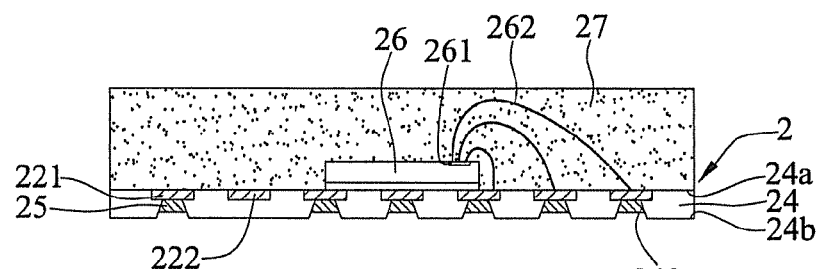

Referring to FIG. 2I, an encapsulant 27 is formed on the first surface 24a of the insulating layer 24 to cover the circuit layer 22, the chip 26 and the bonding wires 262.

Figure 2J:
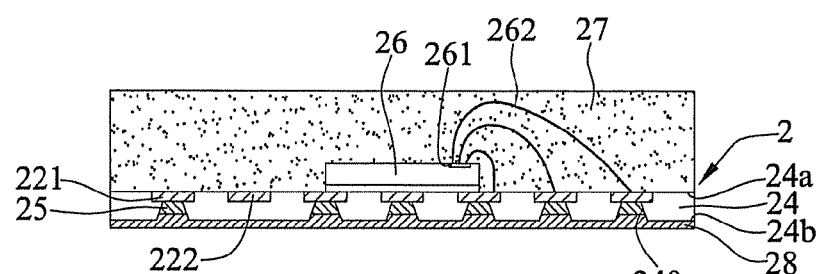

Referring to FIG. 2J, a metal layer 28 is formed on the second surface 24b of the insulating layer 24, in the openings 240 and on the terminals 25 through physical vapor deposition (PVD) or chemical vapor deposition (CVD).

Figure 2K:
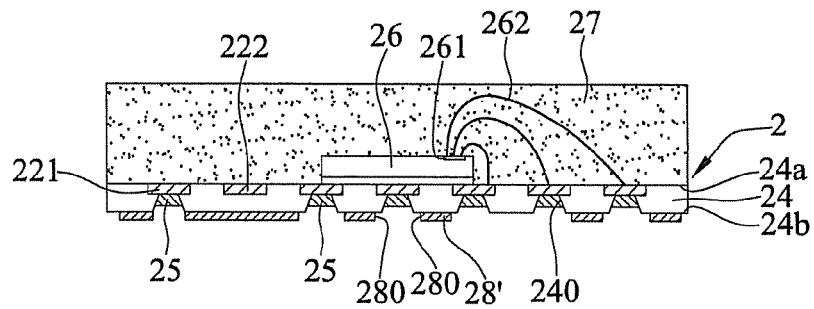

Referring to FIG. 2K, the metal layer 28 is patterned so as to form a ground layer 28' on the second surface 24b and form a plurality of openings 280 in the metal layer 28 for exposing the terminals 25, the openings 240 and portions of the second surface 24b of the insulating layer 24.

Figure 2L:
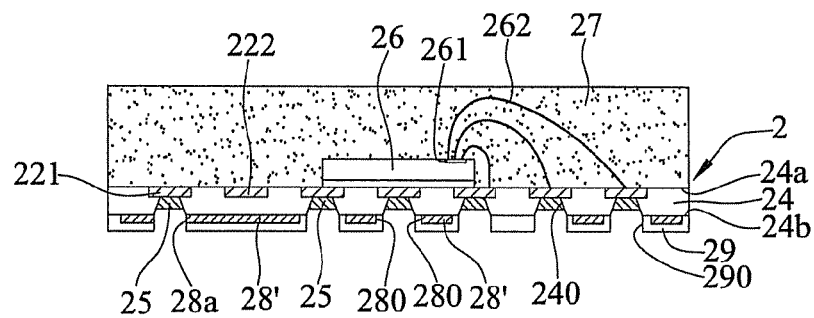

Referring to FIG. 2L, a protection layer 29 made of solder mask or polyimide is formed on the ground layer 28' and the second surface 24b of the insulating layer 24, and a plurality of openings 290 are formed in the protection layer 29 by exposure and development or laser drilling so as to expose the openings 240 of the insulating layer 24, the terminals 25 and portions of side surfaces 28a of the ground layer 28'.

Figure 2M:
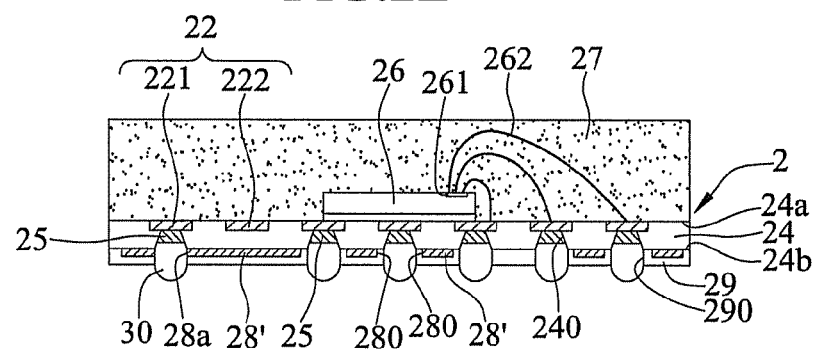
Figure 2M:
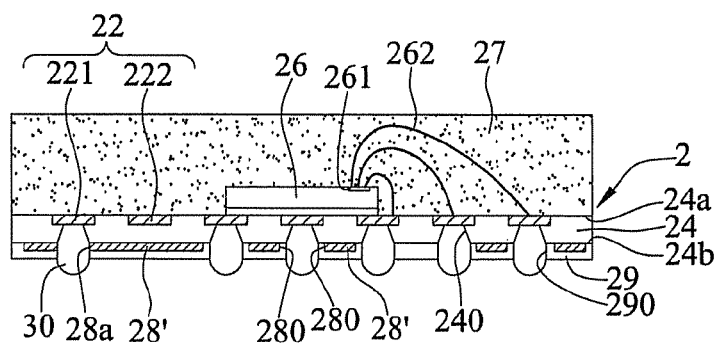

Referring to FIG. 2M, a plurality of solder balls 30 are disposed on the terminals 25 in the openings 290 of the protection layer 29, and portions of the solder balls 30 electrically connect the ground layer 28' so as to allow the RF traces 222 and the ground layer 28' to form a microstrip line having an RF function.

In another embodiment, referring to FIG. 2M', no terminals 25 are formed and a plurality of solder balls 30 are directly disposed on the conductive traces 221 in the openings 240 of the insulating layer 24.

Second Embodiment

FIGS. 3A to 3I show a fabrication method of a carrier-free semiconductor package according to a second embodiment of the present invention.

Figure 3A:
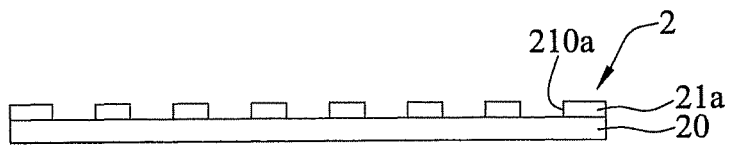
FIGS. 3A to 3I are schematic cross-sectional views showing a carrier-free semiconductor package and a fabrication method thereof according to a second embodiment of the present invention.

Referring to FIG. 3A, a carrier 20 is provided. A first resist layer 21a is formed on the carrier 20 and then patterned so as to form a plurality of openings 210a in the first resist layer 21a for exposing portions of the carrier 20.

Figure 3B:
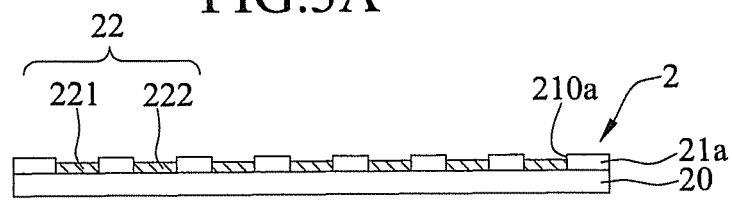

Referring to FIG. 3B, the carrier 20 is used as a current conductive path for electroplating so as to form a circuit layer 22 on the portions of the carrier 20 in the openings 210a. Therein, the circuit layer 22 comprises a plurality of conductive traces 221 and a plurality of RF traces 222.

Figure 3C:
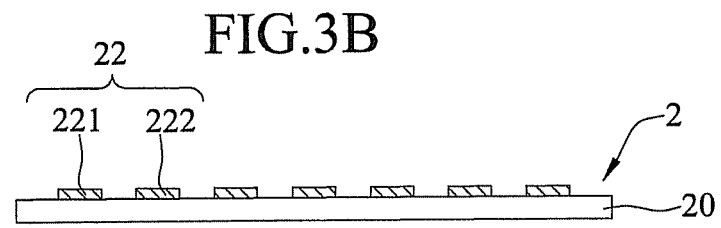

Referring to FIG. 3C, the first resist layer 21a is removed to expose the carrier 20 and the circuit layer 22 on the carrier 20.

Figure 3D:
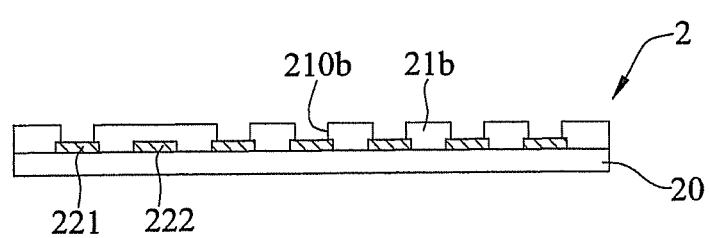

Referring to FIG. 3D, a second resist layer 21b is formed on the carrier 20 and the circuit layer 22 and then patterned so as to form a plurality of openings 210b in the second resist layer 21b for exposing the conductive traces 221 of the circuit layer 22.

Figure 3E:
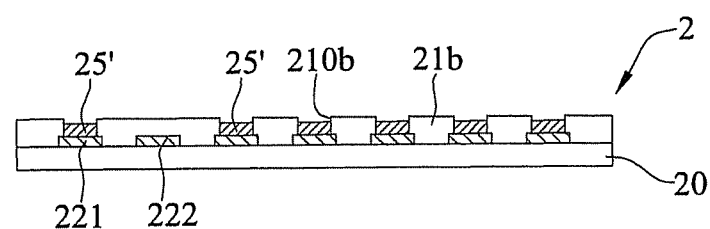

Referring to FIG. 3E, by using the carrier 20 as a current conductive path for electroplating, a plurality of terminals 25' are formed on the conductive traces 221 in the openings 210b by electroplating.

Figure 3F:
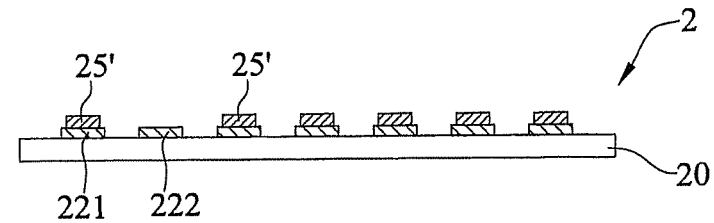

Referring to FIG. 3F, the second resist layer 21b is removed to expose the carrier 20, the circuit layer 22 and the terminals 25'.

Figure 3G:
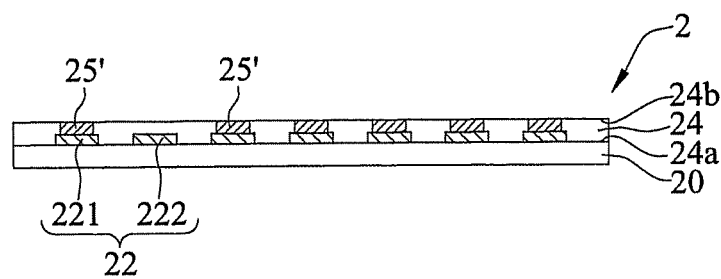

Referring to FIG. 3G, an insulating layer 24 is formed on the carrier 20, the circuit layer 22 and the terminals 25'. The insulating layer 24 has a first surface 24a in contact with the carrier 20 and a second surface 24b opposite to the first surface 24a, and top surfaces of the terminals 25' are exposed from the second surface 24b of the insulating layer 24. In the present embodiment, the top surfaces of the terminals 25' are flush with the second surface 24b of the insulating layer 24.

Figure 3H:
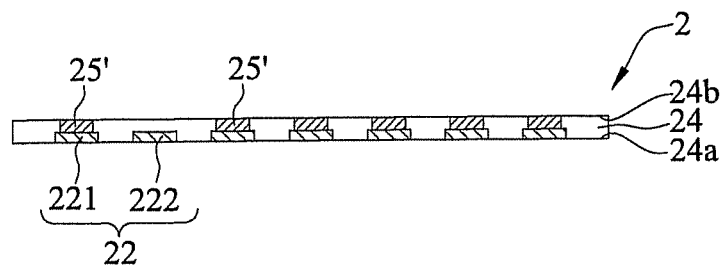

Referring to FIG. 3H, the carrier 20 is removed such that the first surface 24a of the insulating layer 24 and the circuit layer 22 are exposed to form a circuit structure 2.

Figure 3I:
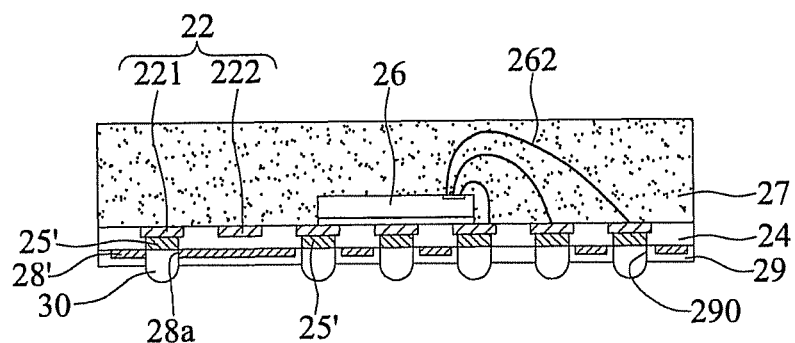

Referring to FIG. 3I, the processes as described in FIGS. 2H to 2M of the first embodiment are performed to dispose a chip 26 on the circuit structure 2, form a plurality of bonding wires 262 electrically connecting the chip 26 and the circuit structure 2, form an encapsulant 27 to cover the circuit layer 22, the chip 26 and the bonding wires 262, form a ground layer 28' on the insulating layer 24 of the circuit structure 2, form a protection layer 29 on the ground layer 28' and the insulating layer 24, and dispose a plurality of solder balls 30 on the conductive traces 221. Therein, the ground layer 28' is electrically connected to the ground of an external circuit board through portions of the solder balls 30 to thereby form a microstrip line in combination with the RF traces 222.

According to the above-described processes, the present invention further provides a carrier-free semiconductor package, which has a circuit structure 2, a chip 26, an encapsulant 27, a ground layer 28' and a plurality of solder balls 30 disposed on the circuit structure 2.

Therein, the circuit structure 2 has an insulating layer 24 with opposite first and second surfaces 24a, 24b, a circuit layer 22 embedded in the insulating layer 24 and expose from the first surface 24a of the insulating layer 24 and having a plurality of conductive traces 221 and RF traces 222, a plurality of openings 240 formed on the second surface 24b of the insulating layer 24 for exposing the conductive traces 221, respectively, and a plurality of terminals 25 formed on the conductive traces 221 in the openings 240.

The chip 26 is disposed on the first surface 24a of the insulating layer 24 and having a plurality of electrode pads 261 electrically connected to the circuit layer 22 through bonding wires or in a flip-chip manner.

The encapsulant 27 is formed on the first surface 24a of the insulating layer 24 to cover the circuit layer 22, the chip 26 and the bonding wires 262.

The ground layer 28' is formed on the second surface 24b of the insulating layer 24 and has a plurality of openings 280 for exposing the terminals 25 and portions of the second surface 24b of the insulating layer 24.

The solder balls 30 are disposed on the terminals 25 and portions of the solder balls 30 electrically connect the ground layer 28'.

The carrier-free package can further comprise a protection layer 29 formed on the ground layer 28' and the second surface 24b of the insulating layer 24. Further, the protection layer 29 has a plurality of openings 290 for exposing the openings 240 of the insulating layer 24, the terminals 25, and portions of side surfaces 28a of the ground layer 28'. The protection layer 29 can be made of solder mask or polyimide.

As described above, the top surfaces of the terminals 25' can be flush with the second surface 24b of the insulating layer 24.

Therefore, the present invention involves forming a circuit structure having an insulating layer and a circuit layer embedded in the insulating layer and having a plurality of conductive traces and RF traces, disposing a chip on a first surface of the insulating layer and electrically connecting the chip and the conductive traces, forming an encapsulant to cover the chip and the circuit layer, forming a ground layer on a second surface of the insulating layer opposite to the first surface, forming a protection layer on the ground layer and the second surface of the insulating layer and forming a plurality of openings in the protection layer for exposing the conductive traces or terminals on the conductive traces and portions of sides surfaces of the ground layer, and disposing a plurality of solder balls on the conductive traces or the terminals in the openings of the protection layer, wherein portions of the solder balls electrically connect the exposed side surfaces of the ground layer so as to allow the RF traces and the ground layer to form a microstrip line having an RF function, thus obtaining a single-layer carrier-free semiconductor package having low cost and simplified RF design.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
   a circuit structure having an insulating layer with opposite first and second surfaces, a circuit layer embedded in the insulating layer and exposed from the first surface of the insulating layer and having a plurality of conductive traces embedded in the insulating layer and radio frequency (RF) traces embedded in the insulating layer, and a plurality of openings formed on the second surface of the insulating layer for exposing the conductive traces, respectively;
   a chip disposed on the first surface of the insulating layer and electrically connected to the conductive traces of the circuit layer, wherein the chip is free from being electrically connected to the radio frequency (RF) traces of the circuit layer;
   an encapsulant formed on the first surface of the insulating layer to cover the circuit layer and the chip; and
   a ground layer formed on the second surface of the insulating layer and having a plurality of openings for exposing the openings of the insulating layer and portions of the second surface of the insulating layer.

2. The semiconductor package of claim 1, further comprising a plurality of solder balls disposed on the conductive traces in the openings of the insulating layer, wherein portions of the solder balls electrically connect the ground layer.

3. The semiconductor package of claim 1, wherein the circuit structure further comprises a plurality of terminals formed on the conductive traces in the openings of the insulating layer.

4. The semiconductor package of claim 3, further comprising a plurality of solder balls disposed on the terminals, respectively, wherein portions of the solder balls electrically connect the ground layer.

5. The semiconductor package of claim 3, wherein top surfaces of the terminals are flush with the second surface of the insulating layer.

6. The semiconductor package of claim 1, further comprising a protection layer formed on the ground layer and the second surface of the insulating layer and having a plurality of openings for exposing the openings of the insulating layer, respectively.

7. The semiconductor package of claim 6, wherein the protection layer is made of solder mask or polyimide.

* * * * *